(12) United States Patent
Mardesich

(10) Patent No.: US 7,732,706 B1
(45) Date of Patent: Jun. 8, 2010

(54) SOLAR CELL CIRCUIT AND METHOD FOR MANUFACTURING SOLAR CELLS

(75) Inventor: Nick Mardesich, San Pedro, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 758 days.

(21) Appl. No.: 11/229,782

(22) Filed: Sep. 16, 2005

Related U.S. Application Data

(60) Provisional application No. 60/610,837, filed on Sep. 17, 2004.

(51) Int. Cl.
H01L 31/00 (2006.01)
H01L 31/075 (2006.01)
H01L 31/04 (2006.01)

(52) U.S. Cl. ............... 136/261; 136/262; 136/249; 136/255; 136/256; 257/458; 257/431; 438/74; 438/81; 438/93

(58) Field of Classification Search ............ 136/255, 136/261, 249, 256, 262
See application file for complete search history.

(56) References Cited

U.S. PATENT DOCUMENTS

| 3,969,746 | A | * | 7/1976 | Kendall et al. ............ 136/255 |
| 3,997,381 | A | * | 12/1976 | Wanlass ................ 438/10 |
| 4,404,422 | A | * | 9/1983 | Green et al. ............ 136/255 |
| 5,223,043 | A | * | 6/1993 | Olson et al. ............ 136/249 |
| 5,405,453 | A | * | 4/1995 | Ho et al. ................ 136/249 |
| 5,616,185 | A | * | 4/1997 | Kukulka ................ 136/244 |
| 5,716,459 | A | * | 2/1998 | Chang et al. ............ 136/249 |
| 6,162,987 | A |   | 12/2000 | Murray et al. ............ 136/253 |
| 6,225,793 | B1 | * | 5/2001 | Dickmann ................ 323/230 |
| 6,252,287 | B1 |   | 6/2001 | Kurtz et al. ............ 257/461 |
| 6,262,358 | B1 | * | 7/2001 | Kamimura et al. ......... 136/244 |
| 6,632,724 | B2 |   | 10/2003 | Henley et al. ............ 438/455 |
| 6,787,818 | B2 |   | 9/2004 | Morrison et al. .......... 257/184 |
| 6,864,414 | B2 |   | 3/2005 | Sharps et al. ............ 136/255 |
| 6,908,832 | B2 |   | 6/2005 | Farrens et al. ............ 438/455 |
| 2001/0018924 | A1 | * | 9/2001 | Hisamatsu et al. ......... 136/249 |

(Continued)

FOREIGN PATENT DOCUMENTS

WO  WO-03073517 A * 4/2003

(Continued)

OTHER PUBLICATIONS

Advertisement for MSS Modular Stock System, Magpul Industries Corp., Copyright 2000-2002.

*Primary Examiner*—Alexa D Neckel
*Assistant Examiner*—Golam Mowla
(74) *Attorney, Agent, or Firm*—Mark Homer

(57) ABSTRACT

The invention is a novel manufacturing method for making multi-junction solar cell circuits that addresses current problems associated with such circuits by allowing the formation of integral diodes in the cells and allows for a large number of circuits to readily be placed on a single silicon wafer substrate. The standard Ge wafer used as the base for multi-junction solar cells is replaced with a thinner layer of Ge or a II-V semiconductor material on a silicon/silicon dioxide substrate. This allows high-voltage cells with multiple multi-junction circuits to be manufactured on a single wafer, resulting in less array assembly mass and simplified power management.

12 Claims, 5 Drawing Sheets

U.S. PATENT DOCUMENTS

| | | | |
|---|---|---|---|
| 2002/0106870 A1* | 8/2002 | Henley et al. | 438/464 |
| 2002/0117675 A1* | 8/2002 | Mascarenhas | 257/87 |
| 2003/0140962 A1* | 7/2003 | Sharps et al. | 136/249 |
| 2004/0132304 A1* | 7/2004 | Farrens et al. | 438/690 |
| 2004/0214434 A1* | 10/2004 | Atwater et al. | 438/689 |
| 2005/0183765 A1* | 8/2005 | Ho et al. | 136/251 |
| 2005/0275067 A1* | 12/2005 | Atwater et al. | 257/616 |
| 2006/0162767 A1* | 7/2006 | Mascarenhas et al. | 136/261 |
| 2007/0137698 A1* | 6/2007 | Wanlass et al. | 136/261 |

FOREIGN PATENT DOCUMENTS

| | | | |
|---|---|---|---|
| WO | WO-2004-017425 | * | 2/2004 |

* cited by examiner

Circuit on Wafer Design

28% Three Junction Cell Design

SOLAR CELL CIRCUIT AND METHOD FOR MANUFACTURING SOLAR CELLS

CROSS-REFERENCE TO RELATED APPLICATIONS

This application claims the priority date associated with provisional application 60/610,837, filed on Sep. 17, 2004, entitled III-V Semiconductor on Silicon Wafer-Solar Cell Circuit.

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND OF THE INVENTION

1. Field of the Invention

This invention relates in general to an improved method of manufacturing solar cells that results in an improved solar cells and solar cell arrays, more specifically to manufacturing multiple junction solar cell circuits on a single wafer, and most specifically to manufacturing multiple solar cells in series on a single wafer.

2. Description of the Related Art

Current multi-junction solar cell circuits for space missions employ Ge, GeAs, and/or InP wafer substrates sectioned from single crystal ingots. An alternative method of manufacture of such substrates is to grow the Ge, GeAs, or InP directly on silicon wafers (through a lattice mismatch process) by growing gradient that slowly matches the silicon lattice to the Ge, GeAs, or InP lattice. In order to promote such growth, relatively high temperatures, of between about 425° C. and 900° C., are required, depending upon the chemical compound being grown.

State of the art solar cells are triple junction solar cells, comprising three full junction layers manufactured on single crystal Ge wafers, that require by-pass diodes between each triple junction cell when assembled in series to prevent damage in case of shadowing. After the triple junction solar cells are formed an out-of-plane stress relief loop is arranged between each of the contacts/conductors interconnection on the cells.

In using this technique for manufacture, non-isolated multi-junction solar cells are manufactured on each Ge wafer. The solar cells are subsequently diced into single isolated cells. This is necessary due to the fact that the cells are connected in parallel on the wafer. End user of this technology generally require high voltage arrays resulting in the cells being connected in series, with by-pass diodes. These interconnects (for arranging the cell circuits in series to form a cell array) require a stress-relief loop as well as the diodes placement on or near the cells make arranging multiple cell circuits on a single Ge wafer problematic.

While multi-junction solar cells manufactured using the above described technique have a relatively high efficiency related to commercial, single junction solar cells, several problems related for use in space missions exist.

First, when arranging the cells into a cell array, a large surface area is required due to the economics (cost) of handling parts on a production line. Second, due to the potentially large differential in voltage across an array between cells, there is a tendency for arcing to occur when the arrays are exposed to a space environment. Third, each wafer, having only one solar cell circuit, can only produce voltages of about 2 volts.

Therefore, it is desired to provide a solar cell circuit using a manufacturing technique that will allow for multiple multi-junction circuits to be placed on one lightweight silicon wafer, producing a high voltage, and obviating the potential for arcing across a solar cell circuit array.

SUMMARY OF THE INVENTION

The invention proposed herein comprises a unique manufacturing method that produces multi-junction solar cell circuits that provide significant increases in potential voltages per each wafer and allows integral by-pass diodes to be formed directly into the substrate on which the solar cells are made.

Accordingly, it is an object of this invention to provide an improved method for manufacturing multi-junction solar cell circuits.

It is a further object of this invention to provide a method for manufacturing solar cell circuits that allows multiple multi-junction cells to be formed on a single wafer substrate.

It is yet a further object of this invention to provide a method for manufacturing solar cell circuits that allows the formation of by-pass diodes directly into the wafer substrate of the solar cell circuits.

This invention meets these and other objectives related to improved solar cell circuits by providing a manufacturing method wherein a silicon based wafer substrate is provided. An insulation layer is formed on the silicon based wafer. A planar by-pass diode is formed integral with the silicon based substrate and insulation layer. A single crystal layer of a compound selected from germanium based compounds, III-V or II-IV semiconductor compounds is bonded to the insulation layer using plasma assisted electrostatic bonding. A wafer cleaving technique is then used to remove a portion of the single crystal layer in order to obtain a particular, preferred thickness for the single crystal layer. In one embodiment of the invention, the excess from the single crystal layer that was cleaved may be used as bonding material in another silicon wafer for the next solar cell circuit. Multi-junction layers are formed on the insulation layer to fabricate a multi-junction solar cell circuit.

In the most preferred embodiment of the invention, a plurality of multi-junction solar cell circuits, manufactured via the process described above, are formed in series on a single silicon wafer substrate. Such a design allows for high-voltage capability for each solar cell wafer as well as minimizing the weight of solar cell arrays.

BRIEF DESCRIPTION OF THE DRAWINGS

In the drawings, which are not necessarily to scale, like or corresponding parts are denoted by like or corresponding reference numerals.

DESCRIPTION OF PREFERRED EMBODIMENTS

The invention, as embodied herein, comprises a novel manufacturing method for making multi-junction solar cell circuits that addresses current problems associated with such circuits by allowing the formation of integral diodes in the cells and allows for a large number of circuits to readily be placed on a single silicon wafer substrate. The standard Ge wafer used as the base for multi-junction solar cells is replaced with a thinner layer of Ge, III-V or II-IV semiconductor material on a silicon/silicon dioxide substrate, which has about 40% less density than the standard Ge wafer. This allows high-voltage cell circuits with multiple multi-junction cells to be manufactured on a single wafer, resulting in less array assembly mass and simplified power management.

Figure 1:
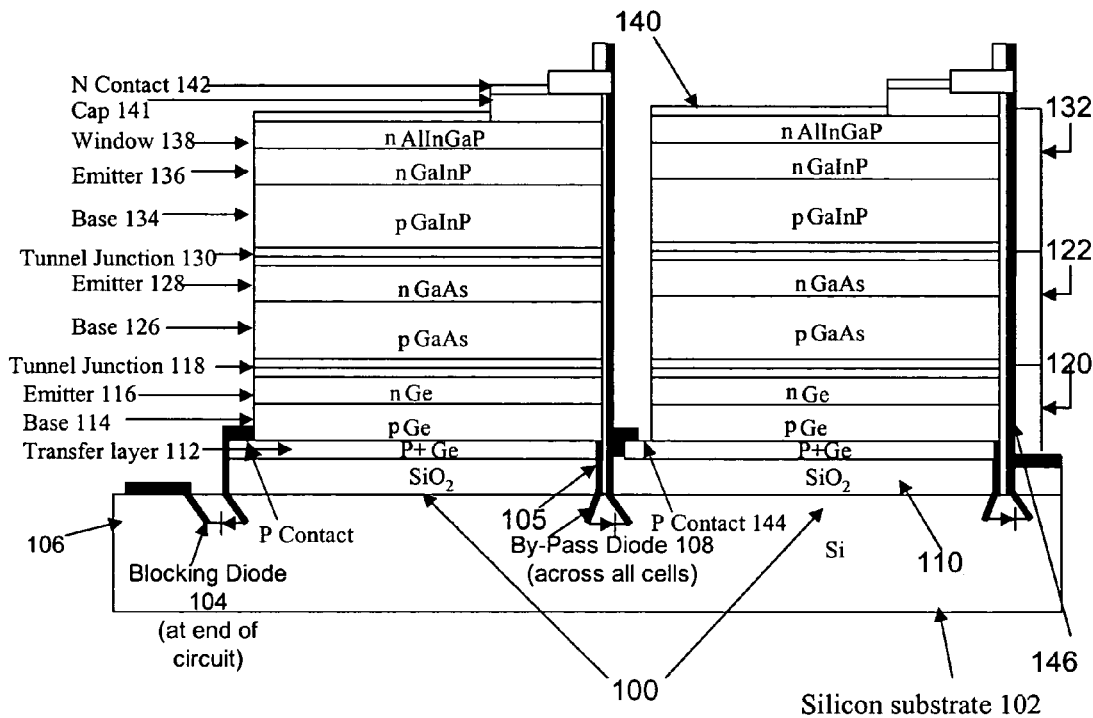
FIG. 1 depicts a cut-away side view of two solar cell circuits of the present invention formed on a single silicon substrate wafer.

FIG. 1 shows an embodiment of the present invention depicting two triple junction solar cells circuits 100 formed in series on a processed silicon based wafer 102. As used herein, doping is a process whereby positively or negatively charged atoms relative to the base material are introduced into a layer of material in order to give the layer a positive or negative charge. The material added as a dopant is selected depending upon the average number of electrons of the material/compound of the layer. The material and specific doping process may be selected by one skilled in the art. Preferred doping materials for the materials layers described herein are phosphorus and boron. The amount of doping of each layer may be selected by one skilled in the art depending upon the type of materials and type of multi-junction solar cell being constructed. As used herein, A blocking diode 104 is formed on an edge 106 of the silicon based wafer 102. A plurality of by-pass diodes 108 are also formed in the silicon based wafer 102. These diodes 104, 108 may be formed by such processes as epitaxial growth or the diffusion of $P^+$ or $N^-$ dopents into the silicon based substrate 102. The number of diodes 104, 108 formed on the silicon based wafer depend upon the number of solar cell circuits 100 desired on a silicon based wafer 102. The diodes 104, 108 are integral to the silicon based wafer and have diode contacts 105 that extend above the wafer 102 so that contacts 142, 144, described below, may be electrically connected to the diodes 104, 108.

An insulating layer 110, preferably of silicon oxide, is formed on the silicon based wafer 102 by processes known in the art such as oxide growth, epitaxial growth or deposition. The insulating layer 110 thickness should be such that the diode contacts 105 still extend above the insulating layer 110. A preferred thickness for the insulating layer is about 1000 angstroms. The insulating layer 110 allows for the diodes 104, 108 to be formed integral with the silicon based wafer 102 and still be operable with other solar cell layers formed above the insulating layer 110.

Figure 2:
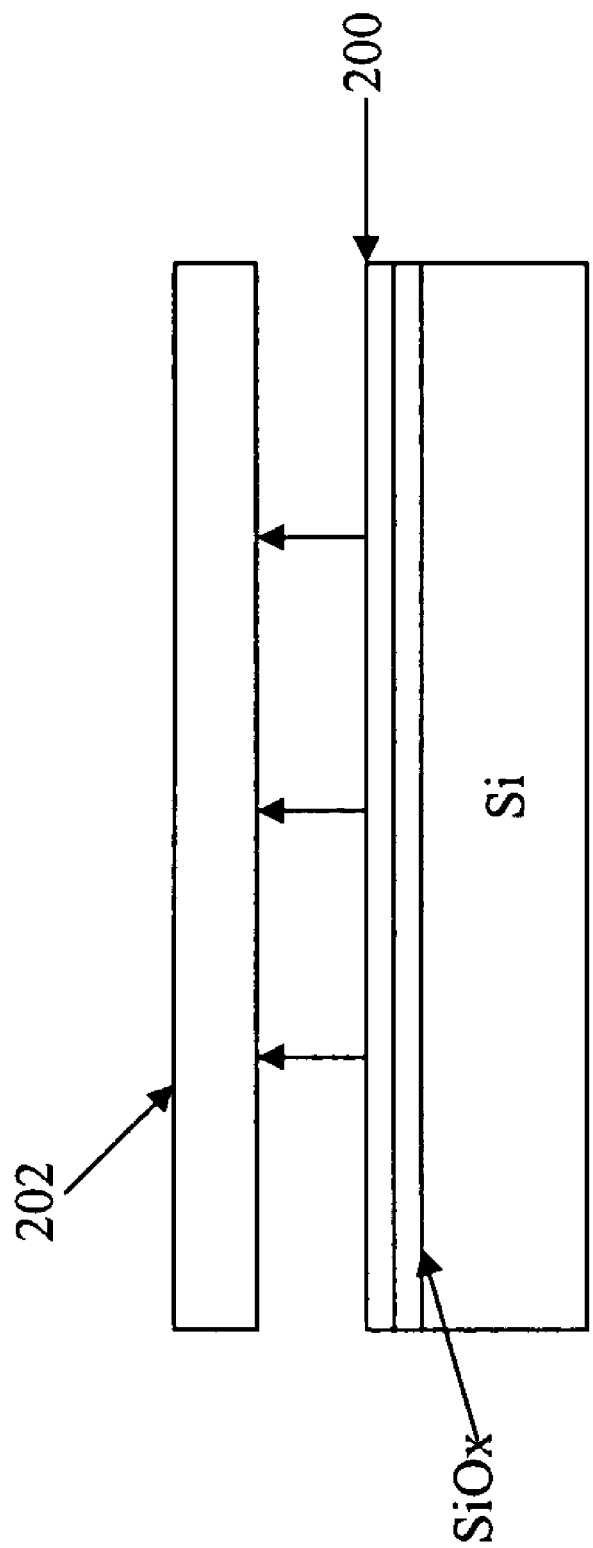
FIG. 2 depicts a side view of a cleaved transfer layer during manufacture of the present invention.

A thin transfer layer 112 comprising a highly positive doped germanium based compound, preferably simple Ge, or semiconductor III-V compound, such as GaAs, is formed on the insulating layer 110. Plasma assisted electrostatic bonding is used to adhere the transfer layer 112 without adhesive to the insulating layer 110. This process is described in U.S. Pat. No. 6,908,832, which is incorporated by reference herein. In general, the process works as follows. The layers to be bonded are placed in a plasma chamber, mechanically supported and held, in a predetermined environment, depending upon the types of materials being bonded. One of the faces of the layers is exposed to a plasma. The layer that was exposed to plasma is then released from being held so that it directly bonds with the other layer. This process allows for bonding of the materials without the need for high temperature anneals or the use of organic or inorganic bonding agents, which would damage the integral diodes 104, 108 formed in the silicon based wafer 102. The result is a thick, single crystal layer 200 of Ge or a III-V semiconductor material (see FIG. 2).

In order to obtain a thin transfer layer 112 that is the appropriate thickness, approximately 3000 angstroms is preferred, the thick transfer layer 200 is wafer cleaved. One wafer cleaving process than may be employed in the present invention is described in U.S. Pat. No. 6,632,724, which is incorporated herein by reference. In general, the process works as follows. Prior to electrostatic bonding, energetic atoms are introduced through the layer to a selected depth for cleaving and an energy source is directed to the region of the layer to be cleaved. The energy source initiates a control cleaving of the layer at the selected depth. In a preferred embodiment of the invention, the excess portion 202 of the thick transfer layer cleaved 202 to create the thin transfer layer 112 may be bonded to another insulating layer 110 placed in series on a similar silicon based wafer 102, described in more detail below, in order to minimize process waste.

After the silicon layer 102/insulting layer 110/transfer layer 112 is formed as described above, layers forming a multi-junction solar cells are formed using processes known in the art, such as MO-CVD. In a preferred embodiment of the invention, a base layer 114 of positively doped Ge is placed on the transfer layer 112 of highly positive doped Ge and a negatively doped emitter layer 116 of Ge is placed upon the base layer 114. A tunnel junction 118 is placed upon the emitter layer 116 in order to complete the first junction 120 of the solar cell circuit 100.

The second junction 122 of the circuit 100 preferably comprises a base layer 126 of positively doped GaAs, an emitter layer 128 of negatively doped GaAs, and a tunnel junction layer 130. The third junction 132 comprises a base layer 134 of positively doped GaInP, an emitter layer 136 of negatively doped GaInP, and a window layer 138 of negatively doped AlInGaP. These materials are preferred for the junction layers because of lattice matching between Ge and GaAs and between GaAs and GaInP.

A anti-reflective coating 140 is placed upon the window layer 138 in order to provide enhanced spectral response and a cap layer 141 is placed between the contacts 142 and the window layer 138. The cap layer 141 is preferably constructed of n+ GaAs. A number of etch back process are preformed to remove all the formed layers down to the transfer layer 112, SiO2 layer 100 and diode 108. This process defines the boundary of the cell and exposes the contact area. A positive contact 105 is placed adjacent to the diode contact 108. An isolation layer is then formed on the edge from the cap layer 141 to the transfer layer 112 on one edge. A negative contact 142 is placed on an edge 146 over the isolation layer of the solar cell circuit 100 that extends to the location of the by-pass diode 108. The contacts 142, 144 are electrically connected with the diode in order to prevent damage related to shadowing. The contacts 142, 144 are constructed of a material that may be selected by one skilled in the art. One material example is chromium/palladium/silver.

Figure 3:
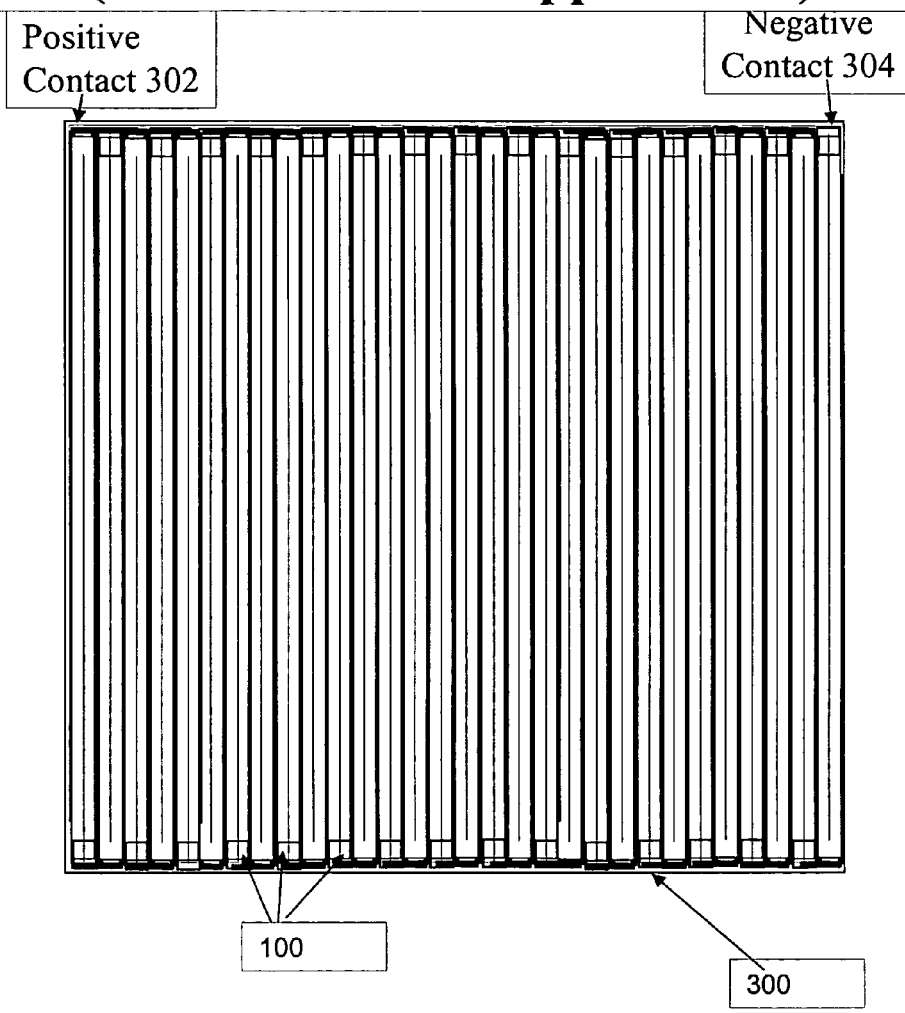
FIG. 3 depicts a top view of a high voltage solar cell comprising 30 solar cell circuits of the present invention on a single silicon substrate wafer.

Referring to FIGS. 1 and 3, in a preferred embodiment of the invention, a plurality of cell circuits 100 are arranged monolithically in series on a single silicon based wafer in order to construct a high-voltage solar cell 300. As described above, the diodes 104, 108 are arranged across the silicon based wafer 102 and a plurality of solar cell circuits 100 are manufactured between the diodes 104, 108 so that the by-pass diode contacts 105 abut an edge 146 of the insulating layers 110 and the bottom transfer layers 112. Solar cell circuits 100 are then manufactured as described above between each pair of diodes 104, 108.

A Monolithic Interconnected Module (MIM) structure is formed using semiconductor etch-back and contact formation processes that has been employed to construct thermophotovoltaic (TPV) MIM structures in order to connect the plurality of solar cell circuits 100 on a single wafer 102. A MIM consists of multiple series of interconnected cells on a common semi-insulating substrate that results in a higher voltage and lower current device and normally incorporates a back surface reflector for optical recuperation for TPVs. There are generally two types of MIM designs currently employed. The first utilizes a highly doped, thick lateral conduction layer (LCL) to conduct the entire length of a cell. The second uses a thinner, lower-doped LCL because the current must flow only a short distance to the nearest grid finger. The second type of MIM design would be employed in the present invention. This arrangement provides for both positive and negative contacts 142, 144 to be formed on the top of the cell 300. An example of MIM fabrication can be found in U.S. Pat. No. 6,162,987 which is incorporated by reference herein.

Employing a standard size silicon based wafer 102 (about 4.0 inch diameter) and employing the present invention manufacturing method, approximately 29 or 30 solar cell circuits 100 may be placed on a single wafer 102. If one selects to add 30 circuits 100 on a wafer 102 the positive contact for the cell 300 will be positioned with the positive contact 302 in the upper left hand corner (and diagonal) and the negative contact 304 in the upper right hand corner (and diagonal) when viewing the cell 300 from above as depicted in FIG. 3. If 29 circuits 100 are selected, the positive contacts 302 are positioned in the upper right and left hand corners of the cell and the negative contacts 304 are positioned in the lower right and left hand corners.

This cell 300 design provides for a high-voltage cell providing 29 or 30 times the voltage compared to a standard multi-junction solar cell. This is due to the fact that each solar cell circuit normally provides about 2 volts. In a standard cell, only one complete circuit is manufactured per wafer. Therefore, a standard cell can only provide about 2 volts of current. However, since the present manufacturing method allows one to place up to 30 circuits 100 on a single wafer, about 60 volts of current can be obtained. This process is not limited to wafer size, larger standard silicon wafers can be employed to create more circuits per wafer and higher voltage circuits.

Figure 4:
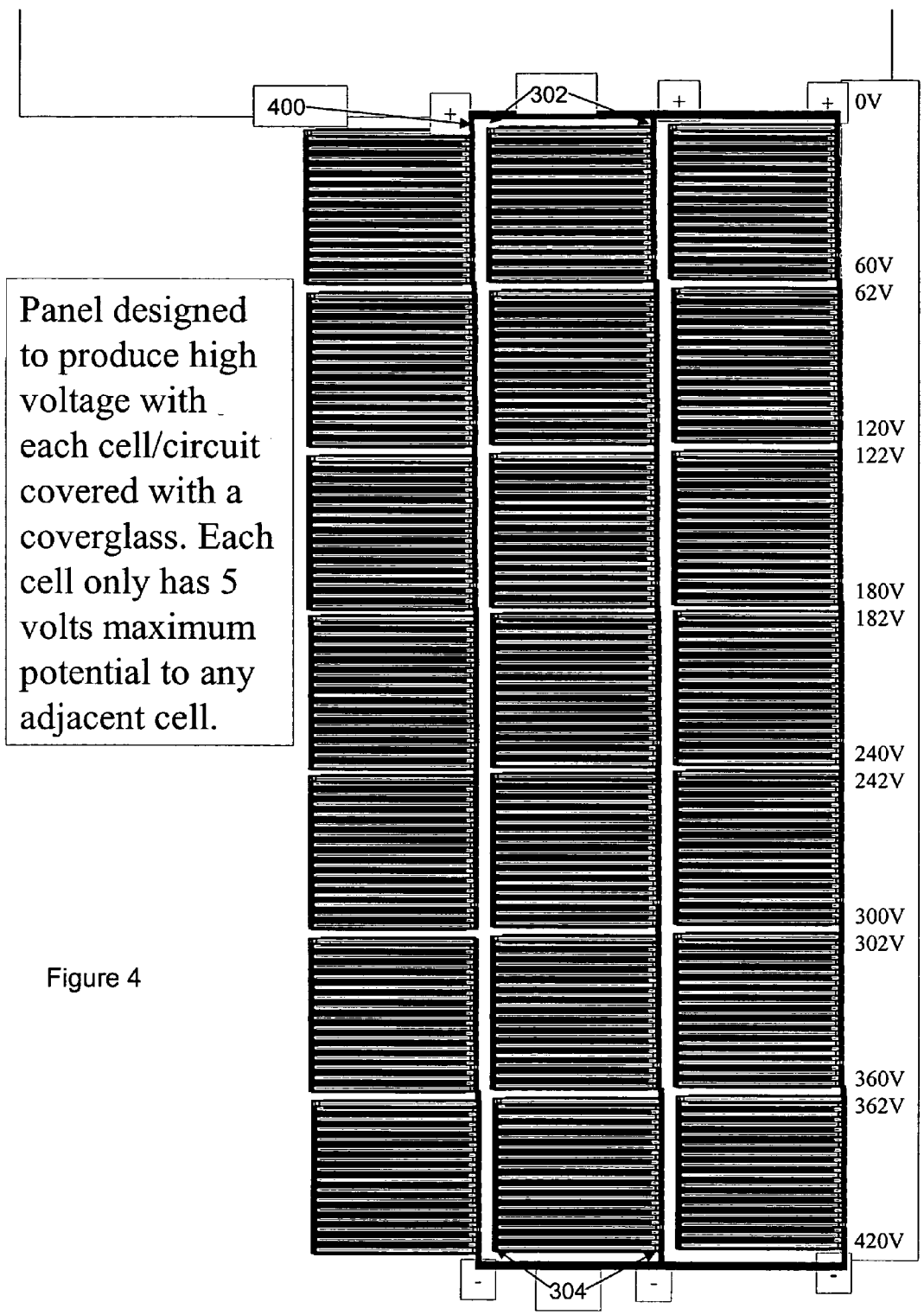
FIG. 4 depicts a top view of a high voltage panel layout for a solar cell array employing multiple high voltage solar cells similar to that depicted in FIG. 3.

Referring to FIG. 4, a solar cell array panel layout is depicted using solar cells 300. Cell panels 300 are placed with the positive contacts 302 arrayed to a conjoining cell's negative contacts 304. Between the positive and negative contacts 302, 304 of each cell 300, as noted above, about 60 volts of current may be provided. Across each cell in the other direction, only about 2 volts of potential exist. Therefore, the maximum potential voltage from any edge of one cell to another in the array is about 5 volts. This potential voltage is too low to cause arcing, as described above. The design further allows for a coverglass 400 to be placed over each cell 300 in order to provide protection for the cells 300

Figure 5:
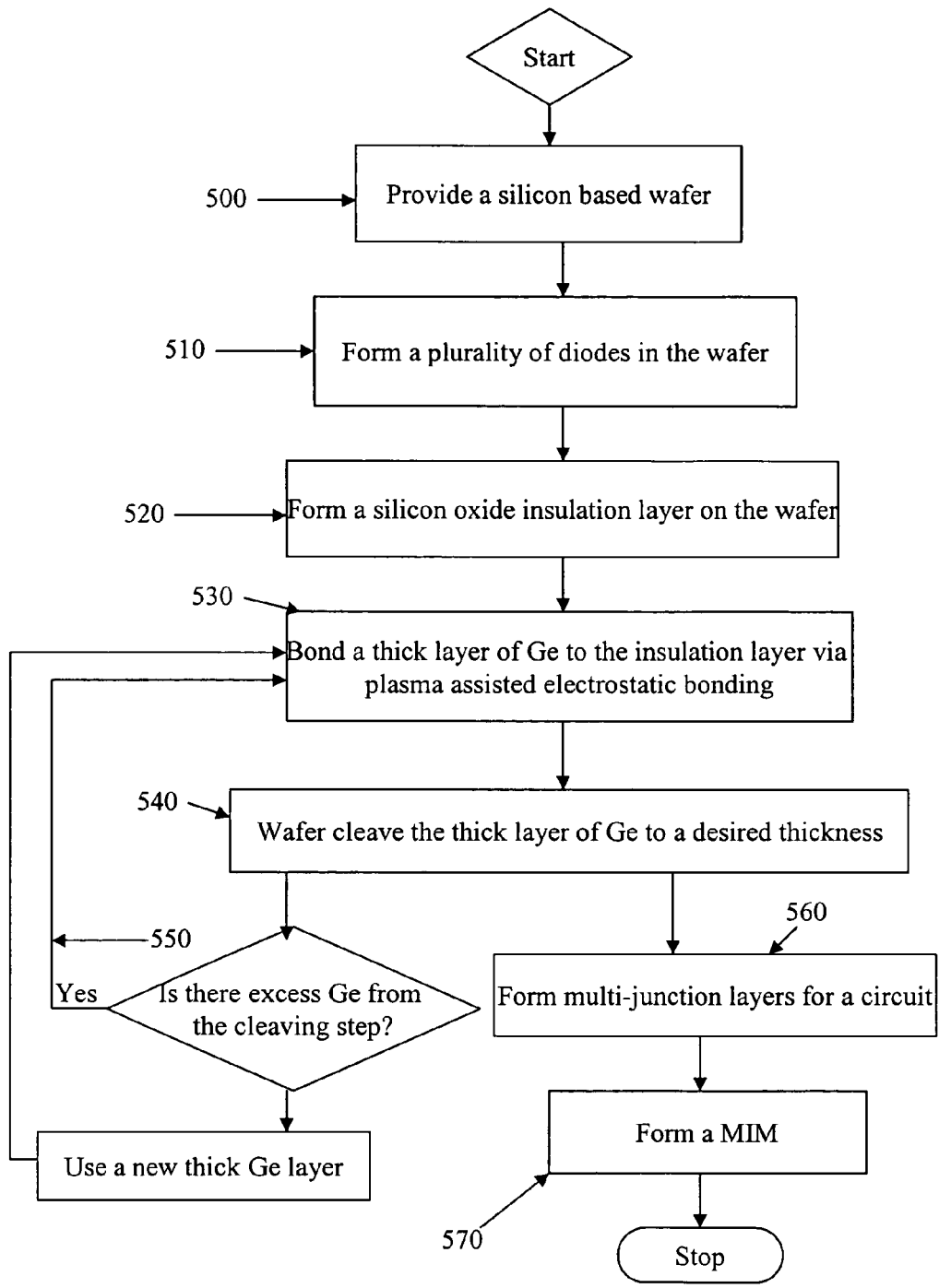
FIG. 5 is a flow diagram of the process steps for manufacturing solar cell circuits of the present invention.

Referring to FIG. 5, a flow diagram depicting the major steps of the manufacturing method used to practice the present invention is provided. A standard sized silicon based wafer is provided 500. Next, a plurality of diodes are formed integral in the silicon based wafer 510. In this step, diode connectors extend to the surface of the silicon based wafer. Third, a silicon oxide insulation layer is formed on the silicon based wafer 520. The preferred insulation layer thickness is about 1000 angstroms so that the diode connectors can be exposed by silicon oxide etch back. Fourth, a thick, single crystal layer of either a germanium based compound, III-V or a II-IV semiconductor compound, prepared with energetic atoms, is bonded to the insulation layer 530. Plasma assisted electrostatic bonding is used to bond the single crystal layer to the insulating layer. Next, a wafer cleaving process, employing the energetic atoms within the single crystal layer, is used to cleave a portion of the single crystal layer to provide a selected thickness for the single crystal layer of about 3000 angstroms 540. Preferably, the excess single crystal layer from the cleaving process is used to form the next in a series of single crystal layers between the plurality of diodes 550. After the cleaving step, multi-junction layers for a solar cell circuit are formed using processes known in the art 560. The wafer is back etched to expose the plurality of multi-junction solar cell layers on the silicon based wafer. Contacts are formed between the transfer layer 112 and diode 105. An isolating layer is then formed on the edge of the layers. Finally, a monolithic interconnected structure is formed to electrically interconnect the negative contacts that are formed on each of the multi-junction solar cell layers circuits to each circuits' diode 570.

What is described are specific examples of many possible variations on the same invention and are not intended in a limiting sense. The claimed invention can be practiced using other variations not specifically described above.

What is claimed is:

1. A method of making a solar cell circuit, comprising the steps of:
   providing a silicon wafer;
   forming an insulation layer directly on the silicon wafer;
   bonding a single crystal layer of a compound selected from germanium based compounds, II-IV semiconductor compounds, or III-V semiconductor compounds using plasma assisted electrostatic bonding directly to the insulation layer;
   wafer cleaving the single crystal layer to obtain a crystal layer of desired thickness and an excess layer; and,
   forming multi-junction layers on the insulation layer to fabricate a multi-junction solar cell circuit.

2. The method of claim 1, wherein the insulation layer comprises silicon oxide.

3. The method of claim 2, further comprising the step of:
   forming a plurality of planar by-pass diodes integral with the silicon wafer and the insulation layer before the bonding step; and,
   forming a plurality of multi-junction solar cell circuits between the planar by-pass diodes.

4. The method of claim 3, wherein the forming a plurality of planar by-pass diodes step is selected from the group of epitaxial growth of the diode into the insulation layer and diffusion of P$^+$ and N$^-$ dopants into the silicon wafer.

5. The method of claim 3, further comprising the step of forming a monolithic interconnected module structure to electronically interconnect the plurality of multi-junction solar cell circuits on the silicon wafer through positive contacts and negative contacts electronically connected with the by-pass diodes.

6. The method of claim 5 wherein the planar by-pass diodes comprise a position at an edge of each of the plurality of multi-junction solar cell circuits.

7. The method of claim 6, further comprising the step of forming a blocking diode on an edge opposite of the planar by-pass diode on a first multi-junction solar cell circuit in the plurality of multi-junction solar cell circuits.

8. The method of claim 7, wherein the multi-junction solar cell circuit comprises a triple junction.

9. The method of claim 8, further comprising the step of using the excess layer for manufacture of another of the plurality of solar cell circuits.

10. The method of claim 9, wherein the triple junction solar cell circuit comprises a first junction having base and emitter layers comprising Ge.

11. The method of claim 10, wherein the triple junction solar cell circuit comprises a second junction having base and emitter layers comprising GaAs.

12. The method of claim 11, wherein the triple junction solar cell circuit comprises a third junction having base and emitter layers comprising GaInP.

* * * * *